(12) United States Patent
Sekiya

(10) Patent No.: US 9,412,637 B2
(45) Date of Patent: Aug. 9, 2016

(54) DEVICE WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 5 days.

(21) Appl. No.: 14/486,416

(22) Filed: Sep. 15, 2014

(65) Prior Publication Data

US 2015/0087207 A1 Mar. 26, 2015

(30) Foreign Application Priority Data

Sep. 26, 2013 (JP) ................................. 2013-199374

(51) Int. Cl.
*H01L 21/02* (2006.01)
*H01L 21/683* (2006.01)
*H01L 21/67* (2006.01)

(52) U.S. Cl.
CPC ....... *H01L 21/6836* (2013.01); *H01L 21/67115* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)

(58) Field of Classification Search
CPC ................. H01L 21/02013; H01L 21/02016; H01L 21/6836
USPC .......................................................... 451/54
See application file for complete search history.

(56) References Cited

U.S. PATENT DOCUMENTS

| 2004/0180549 A1* | 9/2004 | Karasawa | H01L 21/3043 438/695 |
| 2007/0066184 A1* | 3/2007 | Nagamoto | B24B 37/042 451/41 |
| 2007/0099550 A1* | 5/2007 | Ko | B24B 7/228 451/41 |
| 2009/0221215 A1* | 9/2009 | Kawashima | C09J 7/0296 451/54 |

FOREIGN PATENT DOCUMENTS

| JP | 1993/62950 | * 12/1993 |
| JP | 2006-303051 | 11/2006 |

* cited by examiner

*Primary Examiner* — Joseph J Hail
*Assistant Examiner* — Henry Hong
(74) *Attorney, Agent, or Firm* — Greer Burns & Crain, Ltd.

(57) ABSTRACT

A device wafer includes a device area where a plurality of devices are formed on the front side of the device wafer and a peripheral marginal area surrounding the device area. Each device has an adhesion disliking region disliking adhesion to an adhesive tape. An ultraviolet curable protective tape is attached as the adhesive tape to the front side of the device wafer. Ultraviolet radiation is applied to a first area of the protective tape corresponding to the adhesion disliking region of the device wafer to thereby reduce the adhesive force in the first area. The ultraviolet radiation is not applied to a second area of the protective tape corresponding to the peripheral marginal area of the device wafer to thereby maintain the adhesive force in the second area. The device wafer is held through the protective tape while the back side of the device wafer is ground.

3 Claims, 6 Drawing Sheets

DEVICE WAFER PROCESSING METHOD

BACKGROUND OF THE INVENTION

1. Field of the Invention

The present invention relates to a device wafer processing method of processing a device wafer having a plurality of devices formed on the front side, each device having an adhesion disliking region disliking the adhesion to an adhesive tape.

2. Description of the Related Art

In a semiconductor device fabrication process, a plurality of crossing division lines called streets are formed on the front side of a substantially disk-shaped semiconductor wafer such as a silicon wafer and a gallium arsenide wafer to thereby define a plurality of separate regions where a plurality of devices such as ICs and LSIs are respectively formed.

The back side of such a semiconductor wafer is ground by a grinding apparatus to reduce the thickness of the semiconductor wafer to a predetermined thickness. Thereafter, the semiconductor wafer is divided into individual device chips by a cutting apparatus or a laser processing apparatus. These device chips are widely used in various electronic equipment such as mobile phones and personal computers. Prior to grinding the back side of the semiconductor wafer, a protective tape is attached to the front side of the semiconductor wafer, so as to protect the devices formed on the front side of the wafer. The semiconductor wafer with the protective tape is held under suction through the protective tape on a chuck table included in the grinding apparatus, and the back side of the wafer held on the chuck table is ground by a grinding unit included in the grinding apparatus.

SUMMARY OF THE INVENTION

In the case of a MEMS (Micro Electro Mechanical Systems) wafer, a microscopic structure is formed in each device formed on the front side of the wafer. When the protective tape is attached to the front side of the MEMS wafer to protect the devices prior to grinding the back side of the wafer, there is a possibility that the microscopic structure in each device may be damaged in peeling the protective tape after the grinding step. Further, in the case of an imaging device wafer having a plurality of imaging devices such as CMOSs and CCDs formed on the front side, there is a possibility that when the protective tape is peeled from the front side of the wafer, a tack layer constituting the protective tape may be left on the front side of the wafer to cause device failure.

It is therefore an object of the present invention to provide a device wafer processing method which can reduce the possibility of damage to each device or device failure.

In accordance with an aspect of the present invention, there is provided a device wafer processing method of processing a device wafer including a device area where a plurality of devices are formed on the front side of the device wafer and a peripheral marginal area surrounding the device area, each device having an adhesion disliking region disliking the adhesion to an adhesive tape, the device wafer processing method including a protective tape attaching step of attaching an ultraviolet curable protective tape as the adhesive tape to the front side of the device wafer; an ultraviolet radiation applying step of applying ultraviolet radiation to a first area of the ultraviolet curable protective tape corresponding to at least the adhesion disliking region of the device wafer to thereby reduce the adhesive force in the first area in the condition where the ultraviolet radiation is not applied to a second area of the ultraviolet curable protective tape corresponding to at least the peripheral marginal area of the device wafer to thereby maintain the adhesive force in the second area, before or after performing the protective tape attaching step; and a grinding step of holding the device wafer through the ultraviolet curable protective tape and grinding the back side of the device wafer after performing the protective tape attaching step and the ultraviolet radiation applying step.

Preferably, the ultraviolet radiation is applied to a third area of the ultraviolet curable protective tape corresponding to the device area of the device wafer in the ultraviolet radiation applying step.

In the present invention, an ultraviolet curable tape having a tack layer to be cured by the irradiation with ultraviolet radiation is used as the protective tape for protecting the devices. Prior to performing the grinding step of grinding the back side of the device wafer, ultraviolet radiation is applied to the first area of the ultraviolet curable protective tape corresponding to at least the adhesion disliking region of the device wafer, which region dislikes the adhesion to the protective tape, thereby reducing the adhesive force in the first area of the protective tape.

Thus, the adhesive force of the protective tape in the first area corresponding to at least the adhesion disliking region of the device wafer has already been reduced in peeling the protective tape after the grinding step. Accordingly, it is possible to reduce the possibility that the microscopic structure in each device as the adhesion disliking region in the device area may be damaged or device failure may be caused in peeling the protective tape.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
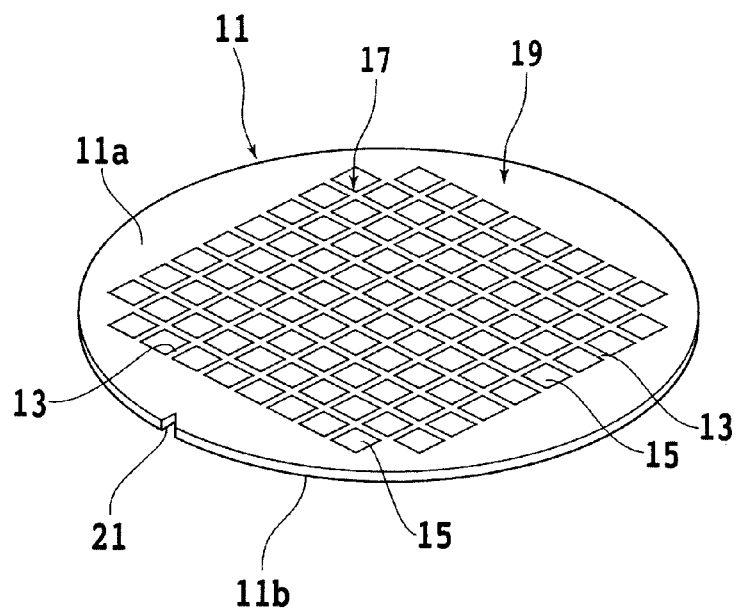
FIG. 1A is a perspective view of a device wafer having a plurality of MEMS devices formed on the front side as viewed therefrom.
Figure 1B:
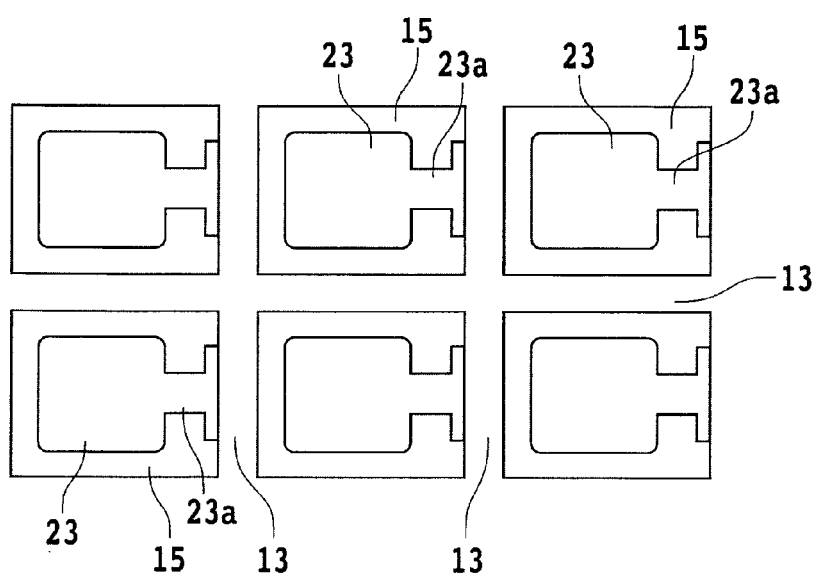
FIG. 1B is an enlarged plan view of a part of the device wafer shown in FIG. 1A.

A preferred embodiment of the present invention will now be described in detail with reference to the drawings. Referring to FIG. 1A, there is shown a perspective view of a device wafer 11 having a plurality of MEMS devices 15 formed on a front side 11a. FIG. 1B is an enlarged plan view of a part of the device wafer 11 shown in FIG. 1A. The device wafer 11 shown in FIG. 1A is a silicon wafer having a thickness of 700 μm, for example. A plurality of crossing division lines (streets) 13 are formed on the front side 11a of the device wafer 11 to thereby define a plurality of separate regions where the plural MEMS devices 15 are respectively formed.

The front side 11a of the device wafer 11 includes a device area 17 where the plural MEMS devices 15 are formed and a peripheral marginal area 19 surrounding the device area 17. The outer circumference of the device wafer 11 is formed with a notch 21 as a mark for indicating the crystal orientation of the silicon wafer.

As shown in FIG. 1B, each MEMS device 15 has a microscopic structure 23. The microscopic structure 23 is a structure such that it is connected at one end 23a to the device wafer 11 in a cantilever fashion and most of the microscopic structure 23 floats over the device wafer 11. When a protective tape is attached to the microscopic structure 23, there is a possibility that the microscopic structure 23 may be damaged in peeling the protective tape. That is, the microscopic structure 23 is a region disliking the adhesion to the protective tape, and this region is therefore defined as "adhesion disliking region" in the description and claims.

Figure 2:
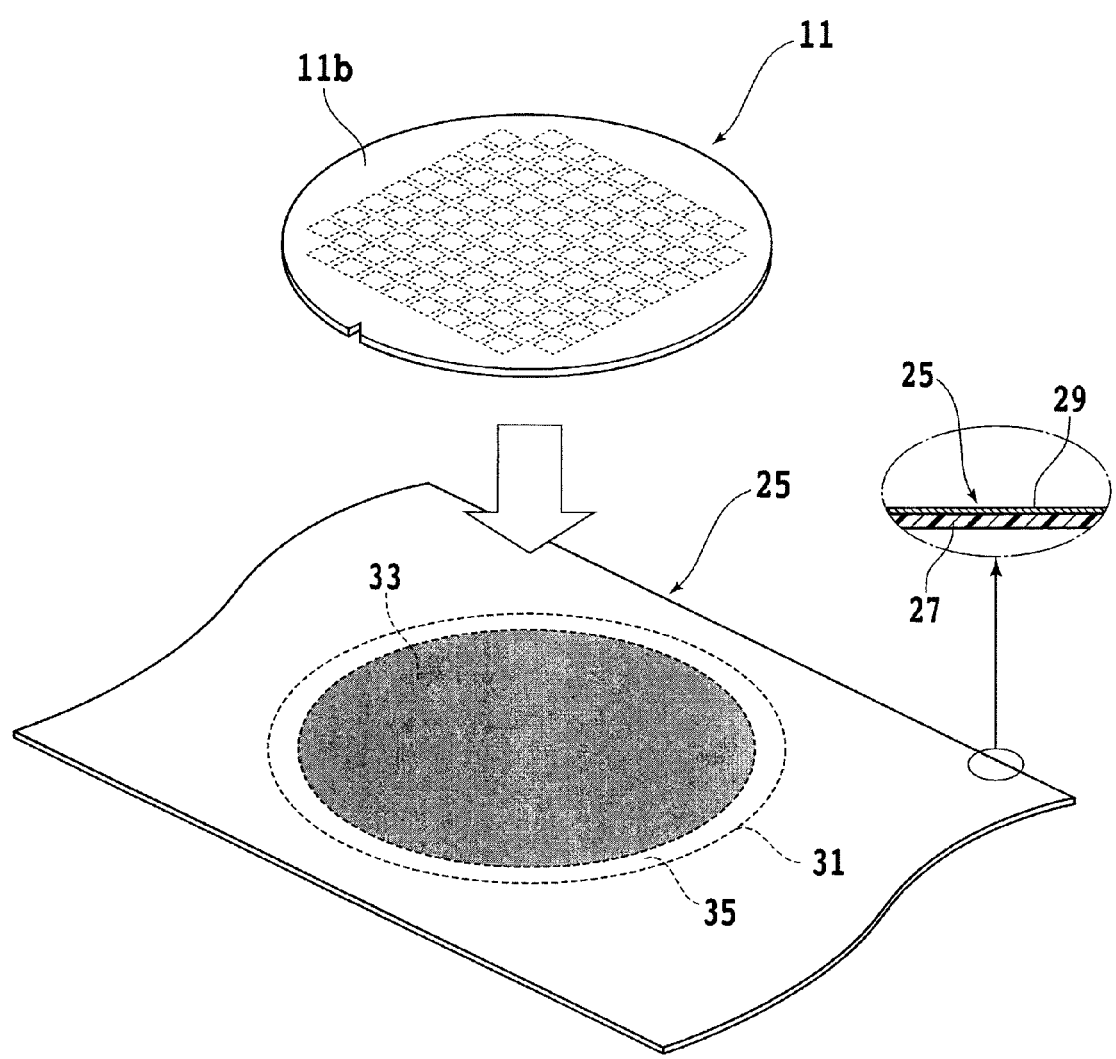
FIG. 2 is a perspective view showing a manner of preliminarily applying ultraviolet radiation to an area of an ultraviolet curable protective tape corresponding to a device area of the device wafer and next attaching the protective tape to the front side of the device wafer.

Referring to FIG. 2, there is shown a perspective view for illustrating a first preferred embodiment of the protective tape attaching step and the ultraviolet radiation applying step in the present invention. Reference numeral 25 denotes an ultraviolet curable protective tape. The protective tape 25 shown in FIG. 2 is originally in the form of a belt in this preferred embodiment. The protective tape 25 is composed of a base sheet 27 and a tack layer (adhesive layer) 29 formed on the base sheet 27. The base sheet 27 is formed of polyolefin (PO) or polyvinyl chloride (PVC), for example. The tack layer 29 is formed of rubber adhesive or acrylic adhesive, for example. The tack layer 29 has a property such that it is cured by the irradiation with ultraviolet radiation to cause a reduction in adhesive force.

Reference numeral 31 denotes an area corresponding to the device wafer 11, showing the outline of the device wafer 11. In the first preferred embodiment shown in FIG. 2, ultraviolet radiation is first applied to an area 33 corresponding to the device area 17 of the device wafer 11 before attaching the protective tape 25 to the front side 11a of the device wafer 11, thereby curing the tack layer 29 in the area 33 of the protective tape 25 to reduce the adhesive force in the area 33 (ultraviolet radiation applying step).

After performing the ultraviolet radiation applying step, the protective tape 25 is attached to the front side 11a of the device wafer 11 in an area 35 corresponding to the peripheral marginal area 19 of the device wafer 11, and the protective tape 25 is cut along the outline 31 of the device wafer 11 (protective tape attaching step). Accordingly, the area 35 of the protective tape 25 is strongly attached to the peripheral marginal area 19 of the device wafer 11, and the area 33 of the protective tape 25 is weakly attached to the device area 17 of the device wafer 11 by a small adhesive force because the tack layer 29 of the protective tape 25 has been cured by the ultraviolet radiation.

Figure 3:
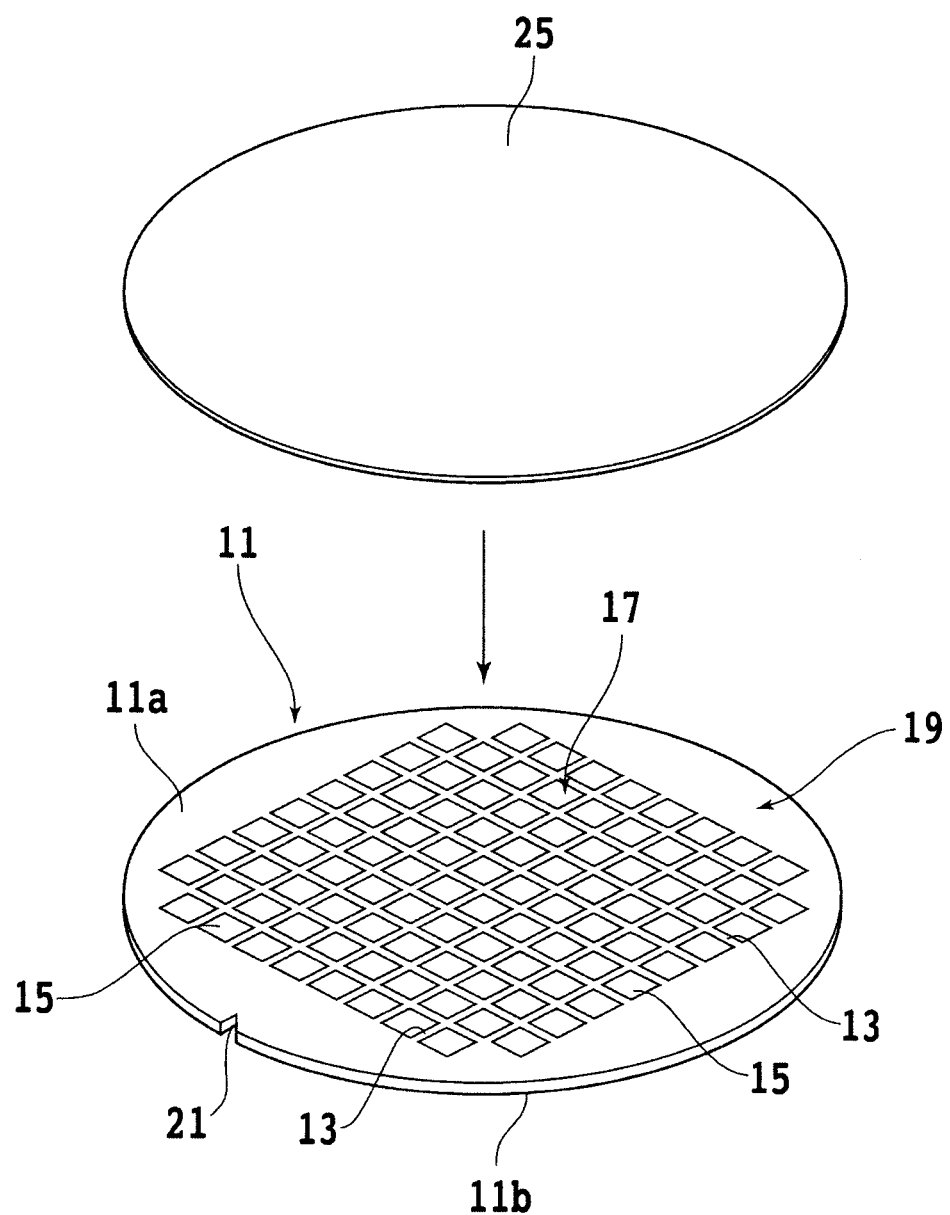
FIG. 3 is a perspective view showing a manner of attaching an ultraviolet curable protective tape to the front side of the device wafer.
Figure 4:
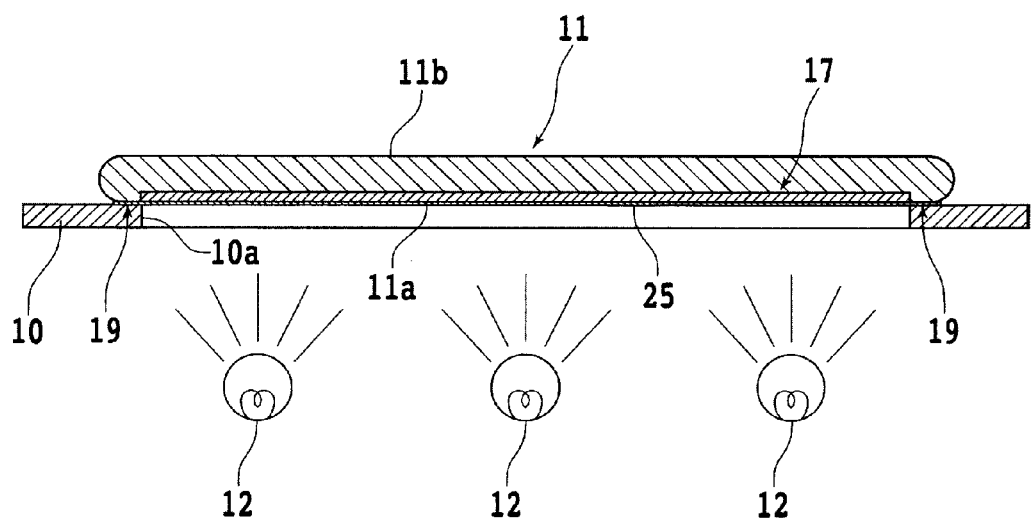
FIG. 4 is a sectional view showing a manner of applying ultraviolet radiation to the area of the protective tape corresponding to the device area of the device wafer after performing the step shown in FIG. 3.

A second preferred embodiment of the protective tape attaching step and the ultraviolet radiation applying step will now be described with reference to FIGS. 3 and 4. As shown in FIG. 3, the ultraviolet curable protective tape 25 has substantially the same outline as that of the device wafer 11 in this preferred embodiment. This protective tape 25 is first attached to the front side 11a of the device wafer 11 (protective tape attaching step). After performing the protective tape attaching step, the ultraviolet radiation applying step is performed as shown in FIG. 4. That is, a mask 10 having an opening 10a corresponding to the device area 17 of the device wafer 11 is prepared, and the device wafer 11 is placed on the mask 10 in the condition where the device area 17 of the device wafer 11 is opposed through the protective tape 25 to the opening 10a of the mask 10. In this condition, ultraviolet radiation is applied from an ultraviolet lamp 12 located below the mask 10 to the protective tape 25, thereby curing the tack layer 29 of the protective tape 25 in the area 33 corresponding to the device area 17 of the device wafer 11 to reduce the adhesive force in the area 33 (ultraviolet radiation applying step).

The area 35 of the protective tape 25 corresponding to the peripheral marginal area 19 of the device wafer 11 is covered with the mask 10. Accordingly, the ultraviolet radiation from the ultraviolet lamp 12 is not applied to the area 35 of the protective tape 25, thereby preventing a reduction in adhesive force in this area 35. After performing the protective tape attaching step according to the first preferred embodiment or performing the ultraviolet radiation applying step according to the second preferred embodiment as mentioned above, a grinding step is performed in such a manner that the device wafer 11 is held under suction through the protective tape 25 and a back side 11b of the device wafer 11 is ground.

Figure 5:
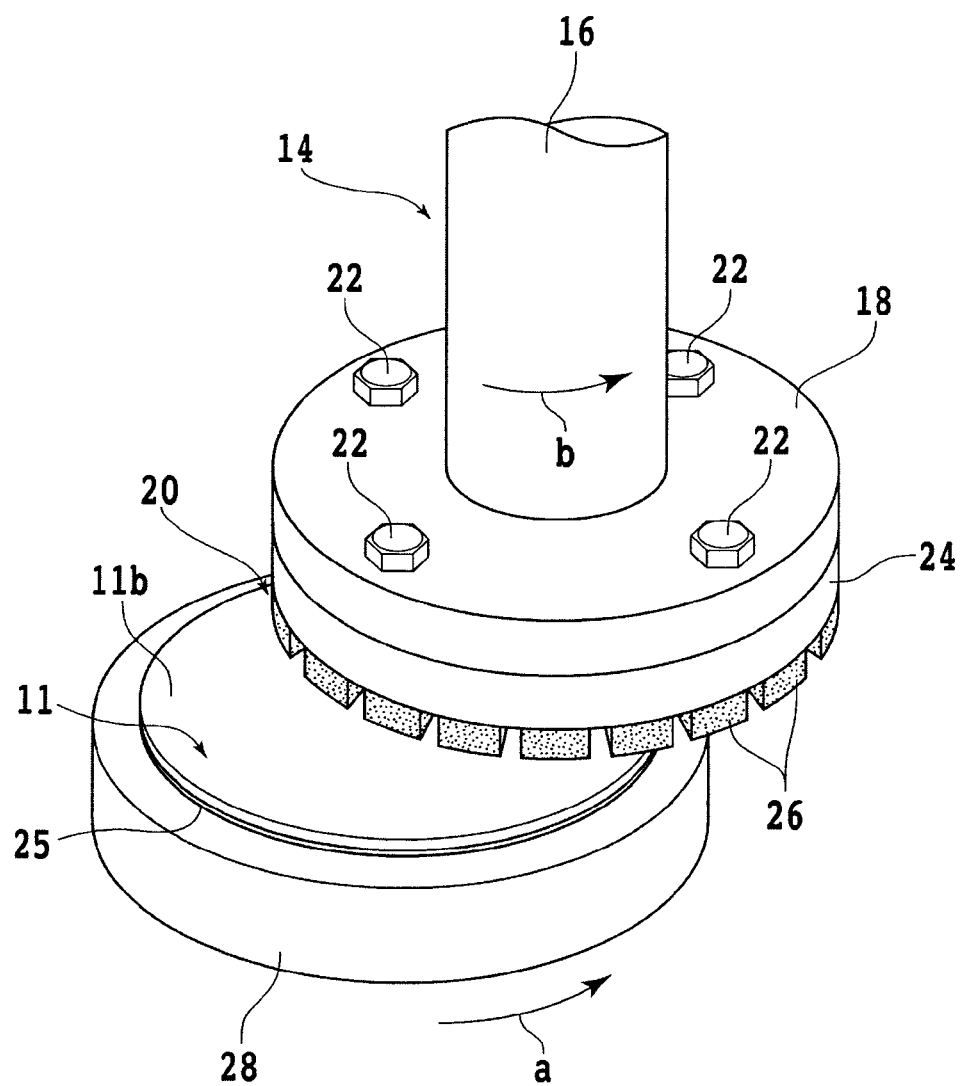
FIG. 5 is a perspective view showing a grinding step of grinding the back side of the device wafer.

This grinding step is performed by a grinding unit 14 (see FIG. 5) of a grinding apparatus (not shown). As shown in FIG. 5, the grinding unit 14 includes a spindle 16 adapted to be rotationally driven, a wheel mount 18 fixed to the lower end of the spindle 16, and a grinding wheel 20 detachably mounted on the lower surface of the wheel mount 18 by a plurality of screws 22. The grinding wheel 20 is composed of an annular wheel base 24 and a plurality of abrasive members 26 fixed to the lower surface of the annular wheel base 24 so as to be annularly arranged at given intervals. The grinding apparatus further includes a chuck table 28 for holding the device wafer 11 under suction. As shown in FIG. 5, the device wafer 11 is held on the chuck table 28 under suction in the condition where the protective tape 25 is in contact with the chuck table 28 and the back side 11b of the device wafer 11 is exposed.

Thereafter, the chuck table 28 is rotated in the direction shown by an arrow a in FIG. 5 at 300 rpm, for example, and the grinding wheel 20 is also rotated in the same direction as the rotational direction of the chuck table 28, i.e., in the direction shown by an arrow b in FIG. 5 at 6000 rpm, for example. Further, a grinding unit feeding mechanism (not shown) is operated to bring the abrasive members 26 of the grinding wheel 20 into contact with the back side 11b of the device wafer 11. Thereafter, the grinding wheel 20 is fed downward by a predetermined amount at a predetermined feed speed, thereby grinding the back side 11b of the device wafer 11. In grinding the back side 11b of the device wafer 11, a contact type or noncontact type thickness gauge (not shown) is used to measure the thickness of the device wafer 11 until the thickness of the device wafer 11 is reduced to a desired thickness, e.g., 100 μm.

The protective tape 25 is firmly attached to the front side 11a of the device wafer 11 in only the area 35 corresponding to the peripheral marginal area 19 of the device wafer 11. Accordingly, although the adhesive force in the area 33 of the protective tape 25 corresponding to the device area 17 of the device wafer 11 is reduced by the application of the ultraviolet radiation, there is no possibility that the protective tape 25 may be undesirably peeled from the front side 11a of the device wafer 11 by the application of a predetermined grinding load in the grinding step mentioned above.

After performing the grinding step, the protective tape 25 is forcibly peeled from the front side 11a of the device wafer 11. The adhesive force in the area 33 of the protective tape 25 corresponding to the device area 17 of the device wafer 11 is reduced by applying the ultraviolet radiation to the area 33 to cure the tack layer 29 in this area 33. Accordingly, the protective tape 25 can be peeled from the front side 11a of the device wafer 11 without causing damage to the microscopic structure (adhesion disliking region) 23 in each device 15.

Figure 6:
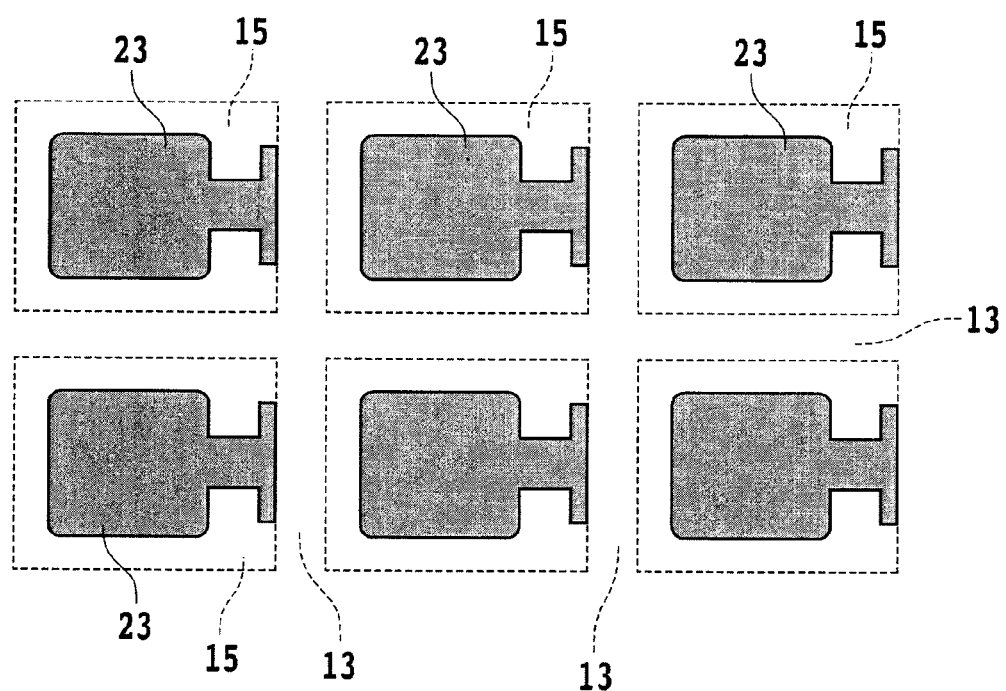
FIG. 6 is an enlarged plan view of a part of the device wafer, showing another preferred embodiment of the ultraviolet radiation applying area.

Another preferred embodiment of the ultraviolet radiation applying area will now be described with reference to FIG. 6. In this preferred embodiment, the ultraviolet radiation is applied to only the area of the protective tape 25 corresponding to the microscopic structure (adhesion disliking region) 23 in each device 15, thereby curing the tack layer 29 in this area to reduce the adhesive force in this area. Accordingly, the ultraviolet radiation is not applied to the remaining area of the protective tape 25 except the area corresponding to the microscopic structure 23 in each device 15, so that the adhesive force in the remaining area is not reduced. That is, the adhesive area where the protective tape 25 is firmly attached to the front side 11a of the device wafer 11 can be increased, so that the device wafer 11 can be fixed more firmly in the grinding step.

The ultraviolet radiation is applied to only the area of the protective tape 25 corresponding to the microscopic structure 23 in each device 15 in the following manner. First, the protective tape 25 is attached to the front side 11a of the device wafer 11. Thereafter, the ultraviolet radiation is applied to the protective tape 25 by using a mask having openings respectively corresponding to the microscopic structures 23. As a modification, prior to attaching the protective tape 25 to the front side 11a of the device wafer 11, the ultraviolet radiation may be applied to the protective tape 25 by using a similar mask. Thereafter, the area of the protective tape 25 where the ultraviolet radiation has been applied is aligned to the microscopic structures 23, and the protective tape 25 is then attached to the front side 11a of the device wafer 11.

While the present invention is applied to the device wafer 11 having the MEMS devices 15 formed on the front side 11a in the above preferred embodiment, the present invention is not limited to the above preferred embodiment, but applicable to a device wafer having a plurality of imaging devices such as CMOSs and CCDs formed on the front side.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device wafer processing method of processing a device wafer including a device area where a plurality of devices each having a microscopic structure that is connected to the device wafer in a cantilever fashion are formed on a front side of said device wafer and a peripheral marginal area surrounding said device area, each device having an adhesion disliking region disliking the adhesion to an adhesive tape, said device wafer processing method comprising:

a protective tape attaching step of attaching an ultraviolet curable protective tape as said adhesive tape to the front side of said device wafer;

an ultraviolet radiation applying step of applying ultraviolet radiation to a first area of said ultraviolet curable protective tape corresponding to the shapes of the plurality of microscopic structures to thereby reduce an adhesive force in said first area in the condition where the ultraviolet radiation is not applied to a second area of said ultraviolet curable protective tape corresponding to at least said peripheral marginal area of said device wafer and to areas within said peripheral marginal area other than the areas that correspond to the shapes of the plurality of microscopic structures to thereby maintain the adhesive force in said second area, before or after performing said protective tape attaching step; and a grinding step of holding said device wafer through said ultraviolet curable protective tape and grinding a back side of said device wafer after performing said protective tape attaching step and said ultraviolet radiation applying step.

2. The device wafer processing method according to claim 1, wherein said ultraviolet radiation applying step is performed before performing said protective tape attaching step.

3. The device wafer processing method of claim 1, wherein each of said devices comprises a MEMS device.

\* \* \* \* \*